United States Patent [19]
Cannard et al.

[11] Patent Number: 5,974,073
[45] Date of Patent: Oct. 26, 1999

[54] MIRRORS FOR SEMICONDUCTOR LASERS

[75] Inventors: Paul J. Cannard, Woodbridge; Anthony J. Dann, Ipswich, both of United Kingdom

[73] Assignee: British Telecommunications public limited company, London, United Kingdom

[21] Appl. No.: 09/047,508

[22] Filed: Mar. 25, 1998

[51] Int. Cl.$^6$ .................. H01S 3/08; H01S 3/19
[52] U.S. Cl. .................. 372/96; 372/45; 372/99; 359/584
[58] Field of Search ................. 372/45, 46, 96, 372/50, 99; 359/584, 585, 586, 588, 589

[56] References Cited

U.S. PATENT DOCUMENTS

| | | | |
|---|---|---|---|
| 5,719,891 | 2/1998 | Jewell | 372/45 |
| 5,724,374 | 3/1998 | Jewell | 372/45 |
| 5,729,566 | 3/1998 | Jewell | 372/96 |
| 5,822,356 | 10/1998 | Jewell | 372/46 |

OTHER PUBLICATIONS

Guden et al, "Material Parameters of Quaternary III–V Semciconductors for Multilayer Mirrors at 1.55 mum Wavelength", Modelling and Simulation in Materials Science and Engineering, Jul. 1996, IOP Publishing UK, vol. 4, pp. 349–357, SP0022036609.

Blum et al, "Electrical and Optical Characteristics of AlAsSb/GaAsSb Distrubuted Bragg Reflectors for Surface Emitting Lasers", Applied Physics Letters, vol. 67, No. 22, Nov. 27, 1995, New York, US, pp. 3233–3235, XP002036667.

Shimomura et al, "Growth of AlPSB and GAPSB on INP by Gas–Source Molecular Beam Epitaxy", Journal of Crystal Growth, vol. 162, No. 3/04, May 1, 1996, pp. 121–125, XP000601326.

Anan et al, "Improved Reflectivity of ALPSB/GAPSB Bragg Reflector for 1.55 $\mu$M Wavelength", Electronics Letters, vol. 30, No. 25, Dec. 8, 1994, pp. 2138/2139, XP000502098.

Streubel et al, "Photopumped Operation of Dry–Etched Lambda=1.5 MUM Vertical Cavity Surface Emitting Lasers", Proceedings of the International Conference on Indium Phosphide and Related Materials, Hokkaido, May 9–13, 1995, no. Conf. 7, May 9, 1995, Institute of Electrical and Electronics Engineers, pp. 464–467, XP000630661.

Miyamoto et al, "Surface Emitting Lasers Grown by Chemical Beam Epitaxy" Journal of Crystal Growth, vol. 136, Nos. 1/4, Mar. 1994, pp. 210–215, XP0005051138.

*Primary Examiner*—Rodney Bovernick
*Assistant Examiner*—Quyen Phan Leung
*Attorney, Agent, or Firm*—Nixon & Vanderhye P.C.

[57] ABSTRACT

A vertical cavity surface emitting laser includes a mirror having first and second layers with first layers containing the elements aluminum, arsenic and antimony and second layers comprising the elements gallium, phosphorus and antimony. Both of these layers are lattice matched to the semiconductor material of the active zone. A VCSEL usually contains two mirrors and, preferably, both mirrors are formed of the elements as specified above. Beryllium can be used to confer p-type conductivity on one mirror and silicon to confer n-type conductivity on the other mirror. Preferably the active zone is formed of semiconductors containing at least one of indium and gallium and at least of phosphorus and arsenic. Conveniently the active zone has a lattice constant substantially equal to that of the indium phosphide and both mirrors are lattice matched to this constant.

36 Claims, 3 Drawing Sheets

MIRRORS FOR SEMICONDUCTOR LASERS

BACKGROUND OF THE INVENTION

1. Field of the Invention

This invention relates to mirrors for semiconductor laser systems and, more particularly, to vertical cavity surface emitting lasers implemented in semiconductor material systems containing at least one of indium and gallium and at least one of phosphorus and arsenic.

2. Related Art

For convenience the term "Vertical Cavity Surface Emitting Laser" is shortened to VCSEL.

The structure of a VCSEL includes two mirrors, e.g. distributed Bragg reflectors, which are located at opposite ends of the lasing zone. In some VCSELs the mirrors are part of the electrical system. The mirrors are required to maintain the lasing process by returning light back to the active region to stimulate more emission. To achieve satisfactory lasing performance VCSELs require good performance from the mirrors and the combined effect of the two mirrors is important. Reflectivities exceeding 99% are usually regarded as necessary. The reflectivity of the two mirrors may be different. The use of two high reflectivity mirrors, e.g. more than 99.5%, is, of course, desirable but other considerations sometimes make it appropriate to use a lower performance mirror in conjunction with a higher performance mirror.

At least one of the mirrors, identified as the "front mirror" in this specification, is required to transmit a suitable proportion of the radiation to act as the output of the VCSEL. For the front mirror 100% reflectivity is, therefore, not appropriate. It is convenient to call the other mirror the "rear mirror".

In order to provide the appropriate reflectivities the mirrors are usually implemented as several layers of suitable semiconductor material. More specifically, two different materials are utilised in the mirrors. The optical and physical theory suggests suitable refractive indices for the materials and the number of layers required to provide a given reflectivity. However the physical theory provides little help in identifying suitable materials for the two layers. More particularly, the physical theory does not help to define the chemical composition of the two layers.

In addition to providing appropriate refractive indices the following material properties are appropriate.

(A) The lattice constant of the mirror material must match the lattice constant of the lasing zone. Usually the lasing zone has a lattice constant substantially equal to that of indium phosphide and, therefore, is it desirable that the mirror match this constant.

(B) The mirrors work by reflecting radiation from internal interfaces in such a manner that multiple reflections reinforce one another. Thus it is necessary for reflected radiation to pass through the layers of the mirror. In fact there is a double pass because incident radiation traverses the layers on the way in and reflected radiation repeats the traverse on the way out. Therefore, high reflectivities require that the layers must have good transmission properties. (The ideal would be 100% but this may not always be achieved in practice.) In addition, the output of the device traverses the front mirror and this is another reason why high transmission is needed.

(C) VCSELs are technically and commercially significant because they are relatively cheap to manufacture. The radiation is transmitted normal to the substrate and the various epitaxial planes. This means that the lasers can be operated in the wafer before division. This is valuable for testing. It is also important for those applications which require an array of lasers.

(D) It is also important that the materials from which the mirrors are made are stable and have an adequate life. In a VCSELs the mirrors define the limits of the lasing system and, in some VCSELs, the mirrors are part of the electrical system, e.g. they transmit the drive current. For this reason it is appropriate to form the mirrors out of semiconductor materials.

(E) When the mirrors are part of the electrical system, the materials from which they are made should have adequate electrical conductivity. It is usually necessary to be able to provide both p-type and n-type conductivity. Thus it is desirable to select semiconductor materials which are able to be doped so as to provide either p-type or n-type conductivity as required.

It is difficult to select materials which offer adequate performance in respect of all of these requirements. This invention relates to semiconductor materials which are at least adequate in respect of all of them.

In Electronic Letters published 16th January 1997, Volume 3 (No. 2) at pages 140 and 141 Genty et al described high reflectivity distributed Bragg reflector structures for 1.5 $\mu$m surface emitting lasers. The reflector structures are composed of alternate layers of Te-doped GaAsSb and un-doped AlAsSb. It is stated that the Te-doping gives the structure n-type conductivity. Without the doping the GaAsSb is highly absorbent. FIG. 2 of the publication shows that a maximum reflectivity exceeding 94% was measured on a mirror with only 11.5 period in the stack. FIG. 2 also shows that, even with n-type doped layers, there is low reflectivity at wavelengths below 1.4 $\mu$m.

Anan et al in Electronic Letters 30, 2138 (1994), describe mirrors comprising AlPSb in one layer and GaPSb in the other layer.

SUMMARY OF THE INVENTION

This invention comprises the use of a first semiconductor material containing the elements aluminium, arsenic and antimony for one of the layers of the mirror, e.g. a distributed Bragg reflector, and a second material containing, gallium, phosphorus and antimony for the other layer. The mirrors (and VCSELs containing them) are particularly suitable for use in telecommunications. The window 1.2–1.7 $\mu$m is widely used for telecommunications, especially two narrower windows one close to 1.3 $\mu$m and the other close to 1.55 $\mu$m. The mirrors are suitable for use at these wavelengths.

For convenience compositions containing only the specified elements will be designated "hosts". The hosts are capable of providing (A)–(D) as mentioned above but it is usually desirable to incorporate dopants to optimise the overall performance e.g. to enhance the electrical conductivity to achieve (E) as mentioned above. Beryllium confers p-type conductivity upon both materials and silicon confers n-type conductivity on both materials.

It is believed that the two host materials can be represented by the chemical formulae First material $AlAs_{(1-x)} Sb_x$ Second material $GaP_{(1-y)} Sb_y$ wherein x and y are fractional values within the range 0–1.

However it is doubtful that this method of representation has much practical significance. The reasons for this will now be explained.

The epitaxial processes are controllable and, in particular, the rate at which the various reactants are provided into the process can be accurately controlled. As a result of this (and other) controls the epitaxial process is reproducible and it can be calibrated. Nevertheless the reaction rates of the various species all differ and, as a result, the quantitative composition of the epitaxial layer is not the same as the quantitative composition of the reactant mixture from which is was prepared. In other words, it is impossible to deduce the quantitative composition of the product from the way in which it was grown.

It might, at least theoretically, be considered possible to analyse the results of the epitaxy and the result of such analysis could calibrate the process. However, the analysis is exceedingly difficult and, in practice, it is not worth carrying out the analysis. The overall result is that the values of x and y in the formulae given above have little or no value as control parameters.

X-ray defraction cannot be used during epitaxial growth but it enables the lattice constant of the deposited layers to be measured accurately after growth. This makes it possible to calibrate the process to grow materials which are lattice matched to the substrate. This is the fundamental requirement and it is convenient to achieve this requirement by direct measurement of the lattice constant. It will also be appreciated that, having calibrated the epitaxial process, it is possible to grow lattice matched materials and, if the refractive indices of the materials are not known, they can be measured. These refractive indices enable the performance of a mirror for any number of layers to be calculated.

The first and second semiconductors identified above can be grown by the technique usually known as "Molecular Beam Expitaxy" (MBE). This technique can also be used to grow the other layers of the VCSEL, e.g. semiconductors containing at least one of In and Ga and at least one of P and As.

The invention, which is more fully defined in the claims, includes VCSELs having mirrors situated at opposite ends of an active zone wherein at least one of the mirrors comprises alternate layers of the first and second semiconductor materials defined above. Preferably both of the mirrors are comprised of the first and second semiconductor materials defined above.

BRIEF DESCRIPTION OF THE DRAWINGS

The invention will now be described by way of example with reference to the accompanying drawings in which.

DETAILED DESCRIPTION OF EXEMPLARY EMBODIMENT

Figure 1:
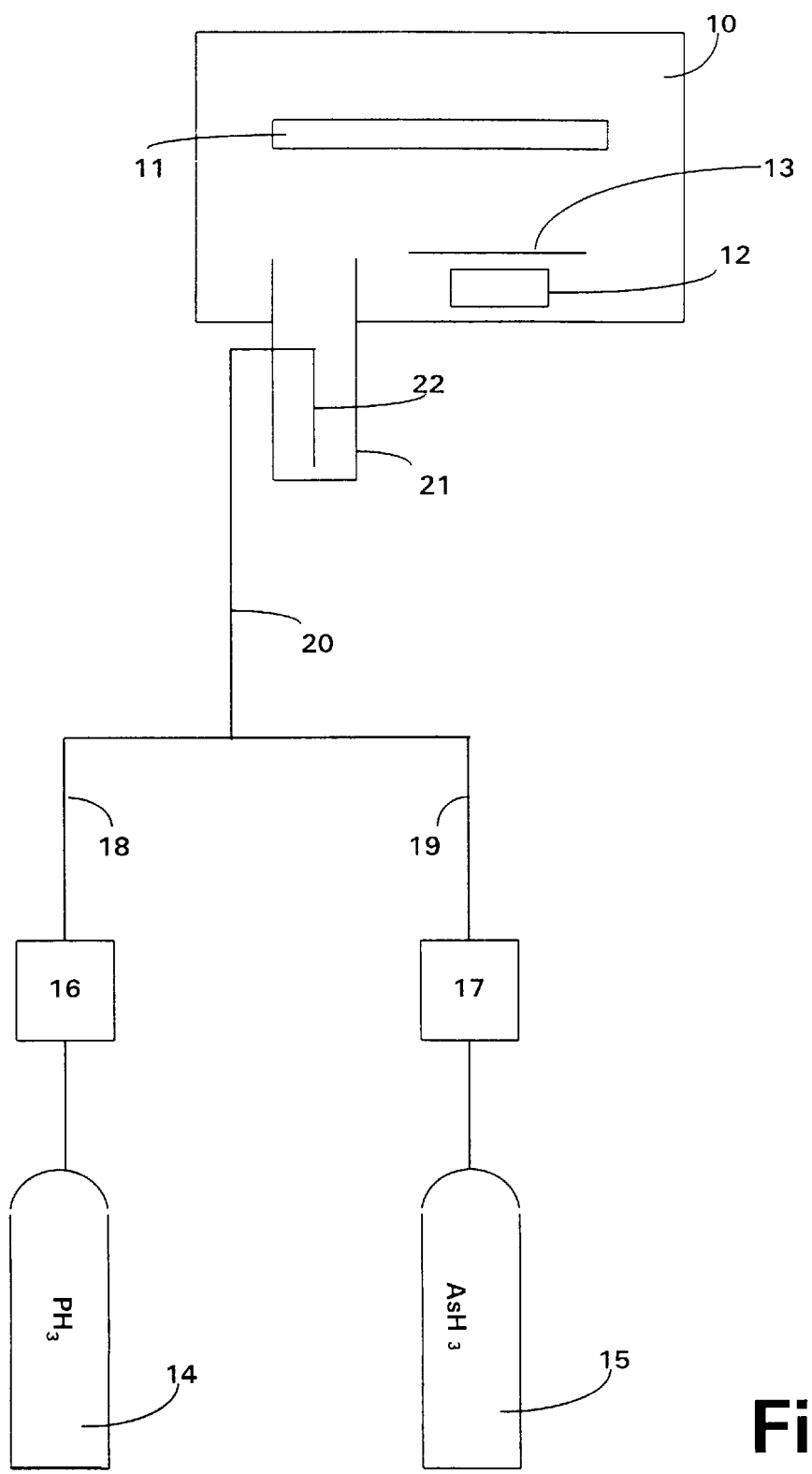
FIG. 1 is a diagrammatic representation of a Molecular Beam Epitaxy apparatus suitable for growing mirror layers in accordance with the invention.

The MBE apparatus illustrated in FIG. 1 comprises a low pressure chamber 10 which contains the workpiece 11. The reaction chamber 10 provides the very low pressure which is necessary for operating the MBE process. The pressure is such that the mean free path of the molecules is many times the distance between the workpiece 11 and the various sources (12, 21) providing the molecular beam. It is necessary to provide a separate source for each reagent which is used but, for convenience of illustration, only two sources are shown in FIG. 1. These are Knudsen effusion cells 12 for solid reagents (and it is usual to choose the element itself as the source reagent) and the cell 21 for gaseous reagents. As is conventional the cells 12 include shutters 13.

One of the mirror layers contains the elements aluminium and antimony whereas the other mirror layer contains the elements gallium and antimony. Other elements e.g. dopants, are also needed for example thulium and silicon. For all of these the element itself is solid and the elements can be used in Knudsen cells as described above. Since antimony is used in two different layers is may be desirable to provide two cells for antimony, i.e. cells adjusted to operate at different feed-rates. Thus it may be appropriate to provide six distinct Knudsen cells to provide these elements but, since they are all substantially the same, only one Knudsen cell 12 is illustrated in FIG. 1.

In addition to the solid elements just mentioned it is necessary to provide arsenic into one layer and phosphorus into the other layer. It is recommended to provide these elements as $AsH_3$ and $PH_3$ respectively; i.e. it is convenient to use gaseous reagents. The arrangement for providing gases into MBE is also shown in FIG. 1. The $PH_3$ is provided from a cylinder 14 and the flow rate is controlled by the mass flow valve 16. Similarly the $AsH_3$ is provided from the cylinder 15 and the flow rate is controlled by the mass flow valve 17. The valves 16 and 17 are selected to give good performance at the flow rates required. Since $PH_3$ requires a significantly higher rate (4–6 scc/M) than the $AsH_3$ (~0.17 scc/M) it is appropriate to choose different controllers for the two lines. Initially, the two gaseous reagents are provided on separate lines 18 and 19 but these merge into a common line 20.

The source arrangements for the gaseous reagents includes a cracking cell 21 which is maintained at temperature of approximately 1050° C. The gaseous reagents are, initially, directed away from the workpiece 11 via the outlet 22. At the high temperature of the cracking chamber 21, the gaseous reagents are decomposed into their elements, namely phosphorus and hydrogen in one case and arsenic and hydrogen in the other case. Because of the very low pressure in the chamber 10, there should be no molecular collisions within the beam. Therefore there is little chance of recombination or other reactions in the beam.

It is emphasised that MBE is a well-known and well understood epitaxial technique and those skilled in the art of MBE will be able to grow the layers required for the mirrors and, therefore, the mirrors of the invention.

Figure 2:
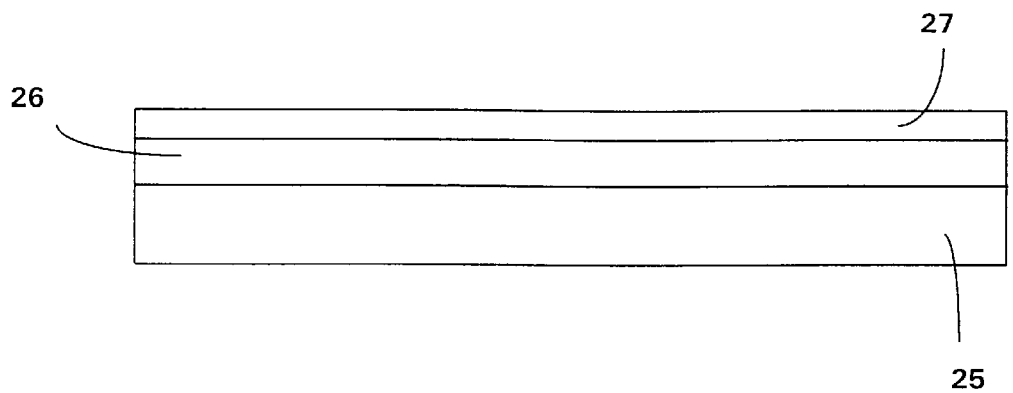
FIG. 2 illustrates a test piece for calibrating the apparatus shown in FIG. 1.

A test piece used for calibrating the apparatus shown in FIG. 1 is illustrated in FIG. 2. It is emphasised that two calibrations are required, namely a first calibration of the layer containing aluminium, arsenic and antimony and a second calibration of the layer containing gallium phosphorus and antimony. The calibration technique is substantially the same in each case.

The calibration method comprises depositing a test layer 27 onto a suitable substrate using MBE as described above. A suitable substrate comprises a buffer layer 26 of indium phosphide grown by metal organic vapour phase epitaxy (MOVPE) onto a wafer 25 of indium phosphide. The ratio of the reagents used to prepare the test piece 27 is adjusted and the properties of the resulting layer are measured. Specifically, the lattice parameter of the layer 27 is measured by X-ray crystallography and the thickness is also measured.

Therefore, by adjusting the ratios of the reactants, the apparatus can be calibrated to grow layers which are lattice matched to InP and the rate of growth can be determined.

The calculated reflectivities of theoretically ideal mirrors are given in Table 1.

The assumptions made to calculate Table 1 are as follows:
(a) The refractive index of AlAsSb is 3.09.
(b) The refractive index of GaPSb is 3.584.
(c) The ideal thickness of the layers is "quarter wave". This means that the ideal thickness is equal to one quarter of the design wavelength taking into account the wavelength in the relevant layer. For AlAsSb the quarter wave thickness is 125 nm and for GaPSb for the quarter wave thickness is 108 nm.
(d) It is also assumed that the transmission is 100%. Since reflected radiation must penetrate the mirror any imperfections in the transmission will reduce the reflectivity.

TABLE 1

Number of layers vs Maximum reflectivity

| Number of Layers | | Number of Periods | |
| --- | --- | --- | --- |
| GaPSb | AlAsSb | Number of Periods | Reflectivity % |
| 11 | 10 | 10.5 | 95.04 |
| 12 | 11 | 11.5 | 96.29 |
| 13 | 12 | 12.5 | 97.23 |
| 14 | 13 | 13.5 | 97.93 |
| 15 | 14 | 14.5 | 98.45 |
| 16 | 15 | 15.5 | 98.85 |
| 17 | 16 | 16.5 | 99.14 |
| 18 | 17 | 17.5 | 99.36 |
| 19 | 18 | 18.5 | 99.52 |
| 20 | 19 | 19.5 | 99.64 |
| 21 | 20 | 20.5 | 99.73 |
| 22 | 21 | 21.5 | 99.80 |
| 23 | 22 | 22.5 | 99.85 |
| 24 | 23 | 23.5 | 99.89 |
| 25 | 24 | 24.5 | 99.92 |
| 26 | 25 | 25.5 | 99.94 |
| 27 | 26 | 26.5 | 99.95 |
| 28 | 27 | 27.5 | 99.96 |
| 29 | 28 | 28.5 | 99.97 |
| 30 | 29 | 29.5 | 99.98 |
| 31 | 30 | 30.5 | 99.98 |

Figure 3:
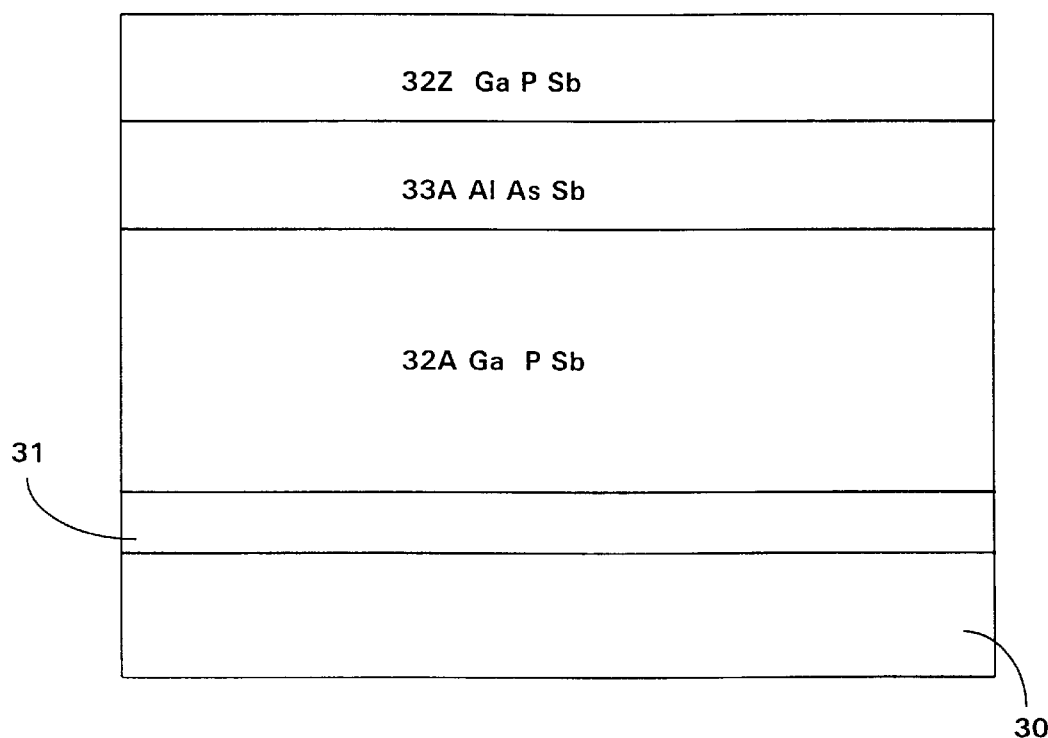
FIG. 3 illustrates a mirror structure in accordance with the invention.

FIG. 3 illustrates a mirror, e.g. a distributed Bragg reflector, which was grown using the calibration information described above. The mirror structure is supported on a wafer 30 of InP with a buffer layer 31 consisting of InP grown by MOVPE onto the wafer 30. The mirror structure contains twenty one different layers but, for ease of illustration, only three layers are illustrated. Specifically, the mirror comprises eleven secondary layers 32 separated by ten primary layers 33. In FIG. 3 this is illustrated as a secondary layer 32A and primary layer 33A and this pair of layers is repeated ten times to give twenty layers. A top secondary layer 32Z completes the mirror shown in FIG. 3 and it provides the twenty-first layer.

(In some nomenclatures the pair of layers 32A, 33A, is called a "period" and the structure is described as 10.5 periods).

The reflectivity of the experimental mirror was 93.56% at 1.55 μm and this compares well with theoretical value of 95.04% as given in table 1. This close correspondence provides a strong indication that the experimentally grown mirror closely matches the theoretically perfect requirements. In particular, there is a strong indication that the layers have the assumed refractive indices and the thicknesses are close to the ideal (i.e. quarter wave). In addition, the good reflectivity implies that the layers have good transmission at the test wavelength of 1.55 μm. In addition, the layers also have good transmission properties at 1.3 μm.

The mirror shown in FIG. 3 was stored for one year under ambient conditions and there was no deterioration of the properties. This indicates that mirrors in accordance with the invention have good stability.

Figure 4:
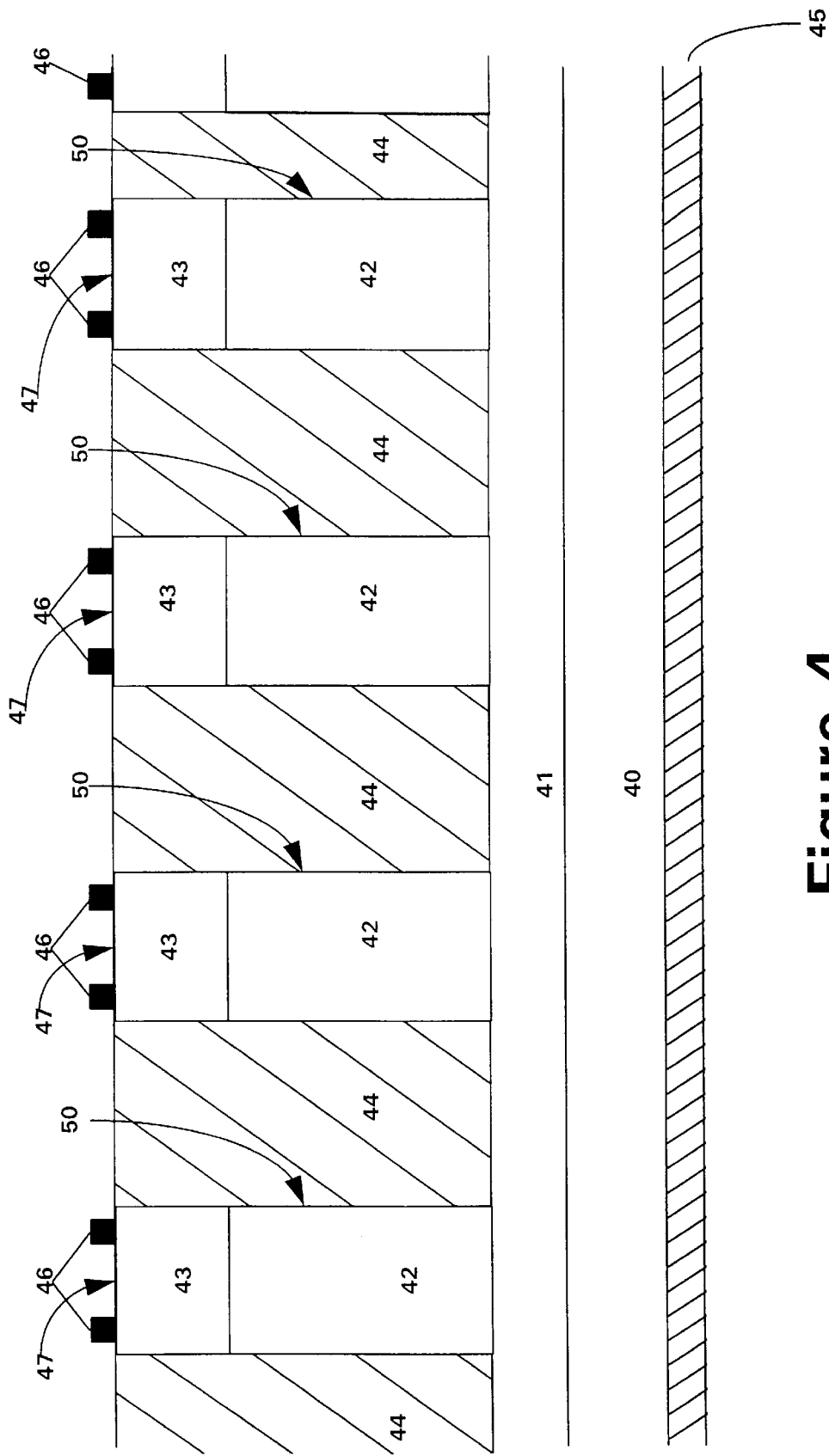
FIG. 4 illustrates VCSELs in accordance with the invention.

FIG. 4 illustrates a vertical cross-section through part of a wafer containing many, e.g. substantially in excess of 20,000, VCSELs 50 each having one mirror in accordance with the invention. The VCSELs are supported on a common substrate 40 of indium phosphide. (In detail not shown in the drawing, this may comprise a wafer and a buffer zone of indium phosphide grown by MOVPE). There is a lower mirror 41 which extends over the whole of the substrate and is common to all the VCSELs 50 grown thereon. In detail not shown, the mirror 41 comprises many layers of quaternary semiconductors each containing gallium, indium, arsenic and phosphorus. This mirror structure is well known for VCSELs and it is conveniently grown by MOVPE.

The active zones 42 of the VCSELs 50 are grown on top of the common mirror 41 and they consist of a multi-quantum well structure of quaternary semiconductors containing indium, gallium, phosphorus and arsenic. These layers are also grown by MOVPE. It will be appreciated that there is no etching, shaping or other processing at this stage of the growth and, therefore, the MOVPE growth can be continuous without removing the workpiece from the reaction chamber.

The active zone 42 is covered by a mirror 43 as illustrated in FIG. 3, i.e. a mirror in accordance with the invention. This mirror is deposited by MBE and it can be grown as a single region covering the whole of the wafer. The growth of the mirror 43 completes the epitaxy and, at this stage, the wafer is patterned to form the individual lasers. The space created by patterning is preferably filled with an electrical blocking layer 44 which also serves as an optical confining region for the active zone 42 which also serves as the core of a waveguide. This blocking layer can be an amorphous material e.g. silicon dioxide or silicon oxynitride.

The structure is completed by metallic electrodes 45 and 46 on the bottom and top faces of the wafer. The bottom electrode 45 is conveniently configured as a continuous sheet which provides a common contact for all of the lasers on the wafer. This is convenient for testing and for any arrays of lasers required in the final product. The top electrode 46 is appropriately etched to provide separate electrodes for each individual laser. Since the top electrode 46 serves as the front facet, i.e. the signal emerges through the electrode 46, it is necessary to provide an aperture 47 for each laser. It is conventional to provide a ring electrode for each laser. The metallic electrodes conveniently consist of a layer of titanium in contact within the semiconductor and a external layer of gold in contact with the titanium.

If desired the configuration can be inverted for some or all of the lasers on the wafer. In this case the bottom electrode 45 must have apertures to permit the emergence of the signal. In this configuration the signal is transmitted via the substrate 40 but this is acceptable in some applications.

After the deposition and etching the electrodes the individual units are tested to identify those which give satisfactory performance. It will be appreciated that it is necessary to allow for imperfections in the epitaxial growth. Nevertheless it should be possible to achieve 10,000 to 20,000 workable lasers from a single wafer.

After the testing the substrate is divided as required. If single components are required the wafer is divided into single components.

There are also applications which require two-dimensional arrays of layers and it will be apparent that the wafer may be divided into arrays as required. Positioning of the lasers within the arrays is defined by the mask which controlled the patterning and, therefore, great freedom of design is available.

We have prepared layers of the semiconductor material AlPSb and disclosed by Anan et al in the document mentioned above. We found that AlPSb is highly hygroscopic and is unstable in an atmospheric environment. As first prepared the AlPSb layer had a smooth surface morphology but this deteriorated rapidly and after an exposure of one week the AlPSb had undergone unacceptable deterioration. This is a substantial disadvantage for use in a VCSEL. This is a strong contrast with mirrors in accordance with the invention which, as stated above, showed no deterioration after storage for one year under ambient conditions.

What is claimed is:

1. A vertical cavity surface emitting laser comprising:
   a front mirror and a rear mirror situated at opposite ends of an active zone,
   at least one of said mirrors including alternate layers of a first semiconductor material and a second semiconductor material wherein the first semiconductor material contains the elements aluminium, arsenic and antimony and the second semiconductor material contains the elements gallium, phosphorus and antimony,
   said first and second semiconductor materials being substantially lattice matched to the semiconductor material of the active zone.

2. A vertical cavity surface emitting laser, as in claim 1, wherein:
   one mirror is doped for n-type conductivity and the other mirror is doped for p-type conductivity.

3. A vertical cavity surface emitting laser as in claim 2, wherein:
   the active zone has a lattice constant substantially equal to that of indium phosphide.

4. A vertical cavity surface emitting laser as in claim 3, wherein:
   the active zone is a multi quantum well structure comprising different semiconductor material each of which contains at least one of indium and gallium and at least one of phosphorus and arsenic.

5. A vertical cavity surface emitting laser comprising:
   a front mirror and a rear mirror situated at opposite ends of an active zone,
   each of said mirrors including alternate layers of a first semiconductor material and a second semiconductor material wherein the first semiconductor material contains the elements aluminium, arsenic and antimony and the second semiconductor material contains the elements gallium, phosphorus and antimony,
   said first and second semiconductor materials being substantially lattice matched to the semiconductor material of the active zone.

6. A vertical cavity surface emitting laser as in claim 5, wherein:
   both mirrors contain at least 20 periods.

7. A vertical cavity surface emitting laser comprising:
   a front mirror and a rear mirror situated at opposite ends of an active zone,
   one of said mirrors including alternate layers of a first semiconductor material and a second semiconductor material wherein the first semiconductor material contains the elements aluminium, arsenic and antimony and the second semiconductor material contains the elements gallium, phosphorus and antimony,
   said first and second semiconductor materials being substantially lattice matched to the semiconductor material of the active zone and
   the other mirror being formed of plurality of different quaternary semiconductor layers, each successive layer containing the elements indium, gallium, phosphorus and arsenic in different proportions to form the mirror.

8. A distributed Bragg reflector for use in a vertical cavity surface emitting laser, said distributed Bragg reflector consisting of:
   layers of a first semiconductor material containing the elements aluminium, arsenic and antimony and layers of a second semiconductor material containing the elements gallium, phosphorus and antimony.

9. A distributed Bragg reflector as in claim 8, wherein:
   the first and second semiconductor materials are doped for p-type conductivity, the dopant being beryllium.

10. A distributed Bragg reflector as in claim 9, wherein:
    the first semiconductor material contains only the elements aluminium, arsenic, antimony and beryllium; and
    the second semiconductor material contains only the elements gallium, phosphorus, antimony and beryllium.

11. A distributed Bragg reflector as in claim 8, wherein:
    the first and second semiconductor materials are doped for n-type conductivity, the dopant being silicon.

12. A distributed Bragg reflector as in claim 11, wherein:
    the first semiconductor material contains only the elements aluminium arsenic antimony and silicon, and
    the second semiconductor material contains only the elements gallium, phosphorus, antimony and silicon.

13. A vertical cavity surface emitting laser comprising:
    a front mirror and a rear mirror situated at opposite ends of an active zone,
    at least one of said mirrors including alternate layers of (a) a first semiconductor material consisting essentially of the elements aluminium, arsenic and antimony and (b) a second semiconductor material consisting essentially of the elements gallium, phosphorus and antimony,
    said first and second semiconductor materials being substantially lattice matched to the semiconductor material of the active zone.

14. A vertical cavity surface emitting laser, as in claim 13 wherein:
    one mirror is doped for n-type conductivity and the other mirror is doped for p-type conductivity.

15. A vertical cavity surface emitting laser as in claim 14 wherein:
    the active zone has a lattice constant substantially equal to that of indium phosphide.

16. A vertical cavity surface emitting laser as in claim 15, wherein:
    the active zone is a multi-quantum well structure comprising different semiconductor material each of which contains at least one of indium and gallium and at least one of phosphorus and arsenic.

17. A vertical cavity surface emitting laser comprising:
    a front mirror and a rear mirror situated at opposite ends of an active zone,
    each of said mirrors including alternate layers of a first semiconductor material and a second semiconductor material wherein the first semiconductor material consists essentially of the elements aluminium, arsenic and antimony and the second semiconductor material consists essentially of the elements gallium, phosphorus and antimony, said first and second semiconductor materials being substantially lattice matched to the semiconductor material of the active zone.

18. A vertical cavity surface emitting laser as in claim 17 wherein:

both mirrors contain at least 20 periods.

19. A vertical cavity surface emitting laser comprising:

a front mirror and a rear mirror situated at opposite ends of an active zone, one of said mirrors including alternate layers of a first semiconductor material and a second semiconductor material wherein the first semiconductor material consists essentially of the elements aluminium, arsenic and antimony and the second semiconductor material consists essentially of the elements gallium, phosphorus and antimony, said first and second semiconductor materials being substantially lattice matched to the semiconductor material of the active zone, and the other mirror being formed of plurality of different quaternary semiconductor layers, each successive layer containing the elements indium, gallium, phosphorus and arsenic in different proportions to form the mirror.

20. A distributed Bragg reflector for use in a vertical cavity surface emitting laser, said distributed Bragg reflector consisting of:

alternating layers of (a) a first semiconductor material consisting essentially of the elements aluminium, arsenic and antimony and (b) a second semiconductor material consisting essentially of the elements gallium, phosphorus and antimony.

21. A distributed Bragg reflector as in claim 20 wherein:

the first and second semiconductor materials are doped for p-type conductivity, the dopant being beryllium.

22. A distributed Bragg reflector as in claim 21 wherein:

the first semiconductor material contains only the elements aluminium, arsenic, antimony and beryllium; and the second semiconductor material contains only the elements gallium, phosphorus, antimony and beryllium.

23. A distributed Bragg reflector as in claim 20 wherein:

the first and second semiconductor materials are doped for n-type conductivity, the dopant being silicon.

24. A distributed Bragg reflector as in claim 23, wherein:

the first semiconductor material contains only the elements aluminium, arsenic, antimony and silicon, and the second semiconductor material contains only the elements gallium, phosphorus, antimony and silicon.

25. A vertical cavity surface emitting laser comprising:

a front mirror and a rear mirror situated at opposite ends of an active zone;

at least one of said mirrors including alternate layers of a first non-oxidized semiconductor material and a second non-oxidized semiconductor material, said first non-oxidized semiconductor material, except for a possible conductivity dopant, consisting essentially of the non-oxidized elements aluminum, arsenic and antimony;

said second non-oxidized semiconductor material, except for a possible conductivity dopant, consisting essentially of the non-oxidized elements gallium, phosphorus and antimony, and said first and second semiconductor materials being essentially lattice-matched to the semiconductor material of the active zone.

26. A vertical cavity surface emitting laser as in claim 25 wherein:

one mirror is doped for n-type conductivity and the other mirror is doped for p-type conductivity.

27. A vertical cavity surface emitting laser as in claim 26 wherein:

the active zone has a lattice constant substantially equal to that of indium phosphide.

28. A vertical cavity surface emitting laser as in claim 27 wherein:

the active zone is a multi quantum well structure comprising different semiconductor material each of which contains at least one of indium and gallium and at least one of phosphorus and arsenic.

29. A vertical cavity surface emitting laser comprising:

a first mirror and a rear mirror situated at opposite ends of an active zone;

each of said mirrors at least one of said mirrors including alternate layers of a first non-oxidized semiconductor material and a second non-oxidized semiconductor material, said first non-oxidized semiconductor material, except for a possible conductivity dopant, consisting essentially of the non-oxidized elements aluminum, arsenic and antimony;

said second non-oxidized semiconductor material, except for a possible conductivity dopant, consisting essentially of the non-oxidized elements gallium, phosphorus and antimony, and said first and second semiconductor materials being essentially lattice-matched to the semiconductor material of the active zone.

30. A vertical cavity surface emitting laser as in claim 29 wherein:

both mirrors contain at least 20 periods.

31. A vertical cavity surface emitting laser comprising:

a front mirror and a rear mirror situated at opposite ends of an active zone;

one of said mirrors at least one of said mirrors including alternate layers of a first non-oxidized semiconductor material and a second non-oxidized semiconductor material, said first non-oxidized semiconductor material, except for a possible conductivity dopant, consisting essentially of the non-oxidized elements aluminum, arsenic and antimony;

said second non-oxidized semiconductor material, except for a possible conductivity dopant, consisting essentially of the non-oxidized elements gallium, phosphorus and antimony, and said first and second semiconductor materials being essentially lattice-matched to the semiconductor material of the active zone; and the other mirror being formed of a plurality of different quaternary semiconductor layers each successive layer containing the elements indium, gallium, phosphorous and arsenic in different properties to form the mirror.

32. A distributed Bragg reflector for use in a vertical cavity surface emitting laser, said distributed Bragg reflector consisting of:

layers of a first non-oxidized semiconductor material which, except for a possible conductivity dopant, consists essentially of the elements aluminum, arsenic and antimony; and layers of a second non-oxidized semiconductor material which, except for a possible conductivity dopant, consists essentially of the elements gallium, phosphorus and antimony.

33. A distributed Bragg reflector as in claim 32 wherein:

the first and second semiconductor materials are doped for p-type conductivity, the dopant being beryllium.

34. A distributed Bragg reflector as in claim 33 wherein:

the first semiconductor material contains only the elements aluminium, arsenic, antimony and beryllium; and the second semiconductor material contains only the elements gallium, phosphorus, antimony and beryllium.

35. A distributed Bragg reflector as in claim 32 wherein:

the first and second semiconductor materials are doped for n-type conductivity, the dopant being silicon.

36. A distributed Bragg reflector as in claim 35 wherein:

the first semiconductor material contains only the elements aluminium arsenic antimony and silicon, and the second semiconductor material contains only the elements gallium, phosphorus, antimony and silicon.

* * * * *